United States Patent [19]
Ida et al.

[11] Patent Number: 5,882,845
[45] Date of Patent: Mar. 16, 1999

[54] METHOD AND DEVICE FOR THE FORMATION OF HOLES IN A LAYER OF PHOTOSENSITIVE MATERIAL, IN PARTICULAR FOR THE MANUFACTURE OF ELECTRON SOURCES

[75] Inventors: Michel Ida, Voreppe; Brigitte Montmayeul, Bernin, both of France

[73] Assignee: Commissariat a l'Energie Atomique, Paris, France

[21] Appl. No.: 696,717

[22] Filed: Aug. 14, 1996

[30] Foreign Application Priority Data

Aug. 17, 1995 [FR] France .................................. 95 09879

[51] Int. Cl.$^6$ ........................................................ G03F 7/00
[52] U.S. Cl. ............................ 430/323; 430/396; 430/330
[58] Field of Search ......................................... 430/323, 320, 430/396, 322, 330, 23, 24, 4, 5, 6, 313; 216/56

[56] References Cited

U.S. PATENT DOCUMENTS

| | | | |
|---|---|---|---|
| 4,118,288 | 10/1978 | Ruckl ........................................ | 430/6 |
| 4,377,633 | 3/1983 | Abrahamovich et al. . | |
| 4,820,612 | 4/1989 | Mase et al. ............................. | 430/330 |
| 4,857,161 | 8/1989 | Borel et al. ......................... | 204/192.26 |
| 5,277,638 | 1/1994 | Lee . | |
| 5,482,486 | 1/1996 | Vaudaine et al. ........................... | 445/3 |

FOREIGN PATENT DOCUMENTS

| | | |
|---|---|---|
| 338625 | 1/1992 | European Pat. Off. . |
| 338625 B1 | 1/1992 | European Pat. Off. . |
| 2 593 953 | 8/1987 | France . |
| 2 663 462 | 12/1991 | France . |
| 2 687 839 | 8/1993 | France . |

OTHER PUBLICATIONS

Patent Abstract of Japan, JP1077521, vol. 13, No. 282, (M–843), Jun. 1989.
Patent Abstract of Japan, No. JP5027104, vol. 17, No. 302 (P–1553), Jun. 1993.
"Production and Applications of Nuclear Track Microfilters", by P. Vater, Nuclear Track Radiat. Meas., vol. 15, No. 1–4, pp. 743–749, 1988.
"Ion Tracks and Microtechnology Principles and Applications", by Reimar Spohr, edited by Klaus Bethge.

*Primary Examiner*—Kathleen Duda
*Assistant Examiner*—John VanderWilt
*Attorney, Agent, or Firm*—Pearne, Gordon, McCoy & Granger LLP

[57] ABSTRACT

A method and a device for the formation of holes in a layer of photosensitive material, in particular for the manufacture of electron sources.

This method is characterized in that a membrane (121) with micro-perforations (122) is laid onto the layer of photosensitive material (120); the layer of photosensitive material is insolated through the membrane (121) in order to print areas (125) corresponding to the micro-perforations (122); the membrane (121) is separated from the layer of photosensitive material (120) thus insolated and the photosensitive layer (120) is then developed in order to form holes in it corresponding to the insolated areas (125).

9 Claims, 3 Drawing Sheets

METHOD AND DEVICE FOR THE FORMATION OF HOLES IN A LAYER OF PHOTOSENSITIVE MATERIAL, IN PARTICULAR FOR THE MANUFACTURE OF ELECTRON SOURCES

BACKGROUND OF THE INVENTION

This invention relates to a method and a device for the formation of holes in a layer of photosensitive material.

It is notably applicable to the manufacture of micro-point cathode electron sources which are used particularly for the production of imaging devices operating by cathodoluminescence excited by field emission.

The invention allows, for example, manufacturing of flat micro-point screens of a large size, for example greater than 14 inches (about 35 cm), and even flat micro-point screens having a surface area close to 1 m².

It is of course understood that screens of a size significantly greater can be developed thanks to this invention.

Micro-point cathode electron sources and their manufacturing methods are described, for example in documents (1), (2), (3) an (4) given as references at the end of this description to which reference can be made.

To facilitate the understanding of the technical problem which has been solved by this invention, a known example of a method of manufacturing a micro-point cathode electron source is described below.

Reference will be made to FIGS. 1 to 3 of the appended drawings.

FIG. 1 shows a structure already developed which includes a substrate 2 with an insulator 4 mounted thereon, a system of cathode conductors 6, a resistive layer 7 and superimposed intersecting grids 8, with an intermediate insulator 10, and a layer 12, for example of nickel, deposited on the surface, used as a mask during the micro-point production operations.

This layer 12 of nickel, the grids 8 and the insulator 10 have holes 14, at the bottom of which micro-points will be subsequently deposited comprising a metal conductor electrically linked to the cathode conductors 6 through the resistive layer 7.

The production of the micro-points will now be explained with reference to FIG. 2.

First one begins by carrying out, for example, the deposition of a layer of molybdenum 16 on the entire structure.

This layer 16 has a thickness of about 1.8 µm.

It is deposited at an angle of incidence normal to the surface of the structure.

This deposition technique allows obtaining cones 18 of molybdenum housed in the holes 14 and having a height of 1.2 to 1.5 µm.

These cones comprise the electron emitting micro-points.

Selective dissolution of the nickel layer 12 is then carried out by an electrochemical method, in such a way that the perforated grids 8, made for example of niobium, are separated as may be seen in FIG. 3, and the electron emitting micro-points 18 are made apparent.

With a few technological variations, the known method which has been described, with reference to FIGS. 1, 2 and 3, is one of those which have been applied up to the present time to produce the micro-points of micro-point cathode electron sources.

In order for the size and the positioning of the micro-points 18 to be correct, it is of course necessary to control perfectly the size of the holes made in the grids 8 and in the insulator 10.

The problem is therefore the following:

Holes having a mean diameter of, for example, 1.3 µm or less, are to be made in all the surfaces which are to receive micro-points.

The methods used at present to produce these holes involve photolithographic methods using direct projection or the photorepetition of an elementary pattern reproduced on all these surfaces.

In the case of large size electron sources, greater than 14 inches (about 35 cm) for example, these methods rapidly become very restricting.

Direct projection requires the production of a large size mask 1 comprising submicron patterns. These patterns are generally made of metal deposited in a thin layer on a silica or glass substrate.

This mask is difficult to make when greater than 14 inches diagonal, with the traditional techniques used in micro-electronics.

With regard to photorepetition, a small size mask is used, the size being determined by the resolution of the patterns used.

For a resolution of 1 µm, a mask with a side of 20 to 50 mm is used, which requires the insolation operation necessary for the photolithography to be repeated a large number of times in order to cover the total surface of the electron source.

Both of these methods (the one using direct projection and the other photo-repetition) are therefore difficult to apply to the production of electron sources of large size.

One aim of this invention is to provide a device and a method allowing the formation of holes in a uniform fashion on large surfaces and which does not have the limitations of the above mentioned methods.

Another aim is to provide a method and a device allowing the simultaneous production of all the holes by a single insolation step. Still another aim is to provide an implementation method which is simple, has a low cost and is suited to the requirements of mass production.

An aim of the invention is also to apply the method to the manufacture of electron sources.

SUMMARY OF THE INVENTION

In order to achieve these aims, the object of the invention is, more precisely, a method for the formation of holes in a layer of photosensitive material, with a free surface, arranged on a substrate, characterised in that a micro-perforated membrane of the filtration membrane type having micro-perforations is laid onto the entire free surface of the layer of photosensitive material; the layer of photosensitive material is insolated through the membrane with insolation light so as to print areas of the photosensitive layer corresponding to the micro-perforations of the membrane; the membrane is separated from the thus insolated layer of photosensitive material, and the photosensitive layer is developed in order to form holes corresponding to the insolated areas in this layer.

The micro-perforated membranes are commercially available; in particular, they are membranes of the type used for filtration.

Hence, the method of the invention is less costly than the known photolithographic methods with masks produced in accordance with micro-electronic techniques.

The micro-perforated membranes are furthermore available in rolls of several meters or tens of meters, which allows large surface areas to be treated.

According to one aspect of the invention, the micro-perforations are distributed randomly over the entire surface of the membrane at a substantially constant density. By way of example, the density can be from a few thousands to a few tens of thousands of holes per square millimeter.

The diameter of the micro-perforations can be chosen in relation to the size of the holes to be created. By way of an example, this diameter can be between 0.2 to 20 μm for the applications envisaged.

The membrane is a non-transparent material, so as to form a mask, and is preferably opaque to the insolation light used.

According to one aspect of the invention, the layer of photosensitive material can be a resin. It is possible in this case to carry out an annealing of this layer in order to increase its hardness and avoid possible deformation thereof during the subsequent stages of the method of the invention.

The invention also has the object of a method for manufacturing a micro-point cathode electron source according to which:

a structure including cathode conductors is formed on a substrate, an electrically insulating layer is formed on the cathode conductors, and, grids are formed on the electrically insulating layer which make an angle with the cathode conductors, holes are formed through the grids and the insulating layer in areas where the grids cross the cathode conductors, micro-points of electron emitting material are formed in these holes, on the cathode conductors.

This method is characterised in that these holes are obtained by forming a layer of positive photosensitive resin at least in said areas, at the surface of the structure, by forming openings (holes) in the layer of resin in accordance with the method described above and by etching the grids and the insulating layer through these openings formed in the resin layer.

The application of the method of the invention to the manufacture of electron sources, in particular for display screens, is very advantageous insofar as it allows the formation of resin masks of large dimensions, and therefore the production of large size screens. In addition, the method is suitable for the mass production of resin masks.

Such mass production is facilitated thanks to an insolation device adapted to the implementation of the method.

To this end, the invention also relates to an insolation device for the formation of holes in a layer of photosensitive material arranged on a substrate, the device comprising a substrate carrier for receiving the substrate with a layer of photosensitive material, a supply spool of blank membrane with micro-perforations and a spool for receiving the membrane after use, the spools being laid out in such a way that a portion of blank membrane is supplied, stretched between them, having a surface area corresponding to the area of the layer of photosensitive material, a conveyor for moving the substrate carrier from a substrate loading position to a position opposite the portion of blank membrane, and then to a substrate unloading position, the means for plating the layer of photosensitive material onto the blank membrane and then for separating the photosensitive layer from this portion of membrane after a step of insolation of the photosensitive layer, and a source of insolation light positioned opposite the portion of blank membrane for insolating the layer of photosensitive material through the micro-perforations of the membrane.

Other characteristics and advantages of this invention will become more apparent from the following description, which makes reference to the Figures in the appended drawings and which is given for illustrative purposes only and which is non-limitative.

DETAILED DESCRIPTION OF THE PREFERRED EMBODIMENTS

Figure 4:
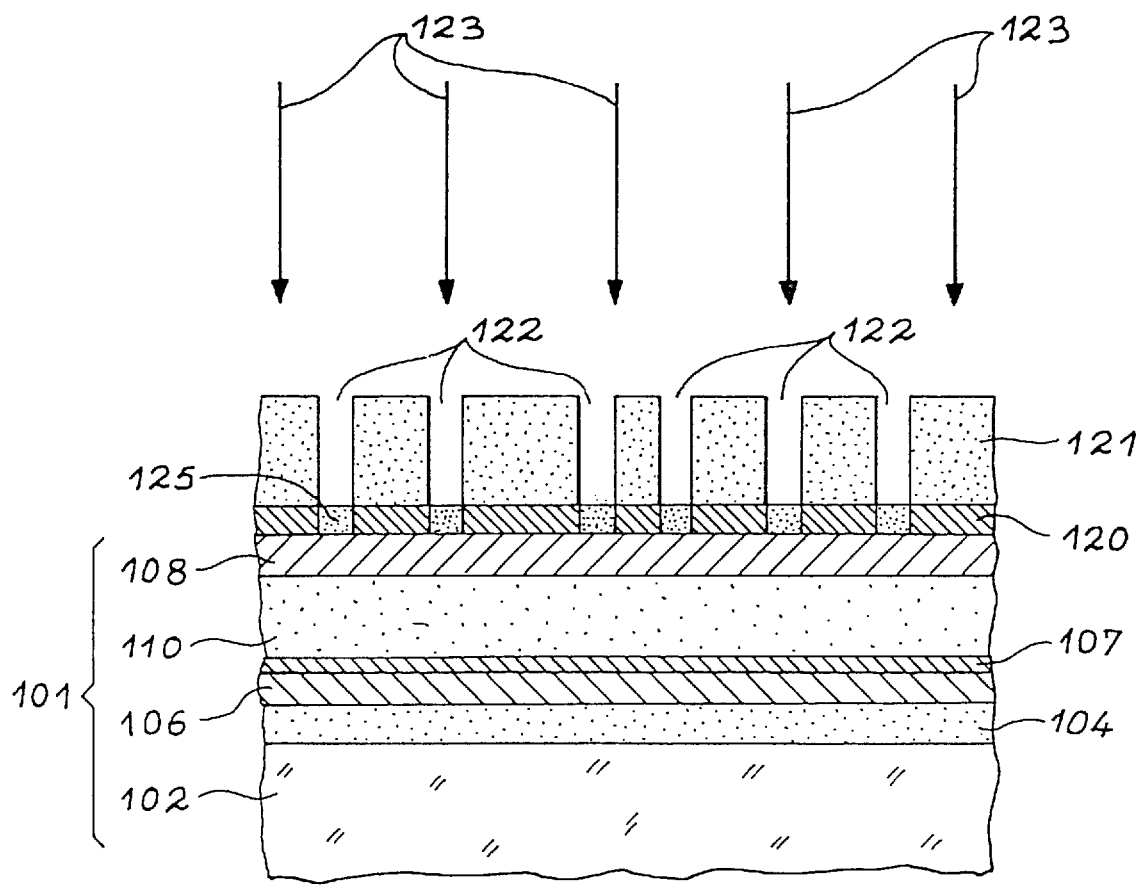
FIG. 4 shows, on a larger scale, a diagrammatic section of a part of a substrate for an electron source and shows the insolation of exposure areas of a layer of photosensitive resin in accordance with the invention.

Reference number 101 on FIG. 4 designates a stack of the type used for the manufacture of electron sources.

Figure 1:
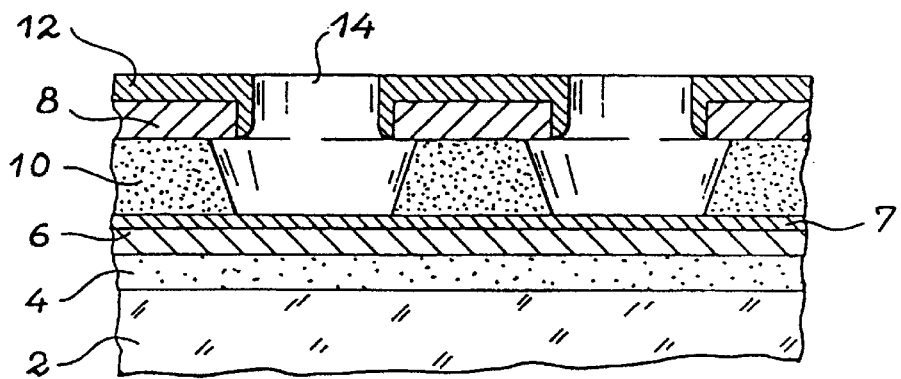
FIGS. 1 to 3, already described, are diagrammatic partial sections illustrating a known method of manufacturing a micro-point cathode electron source.
Figure 2:
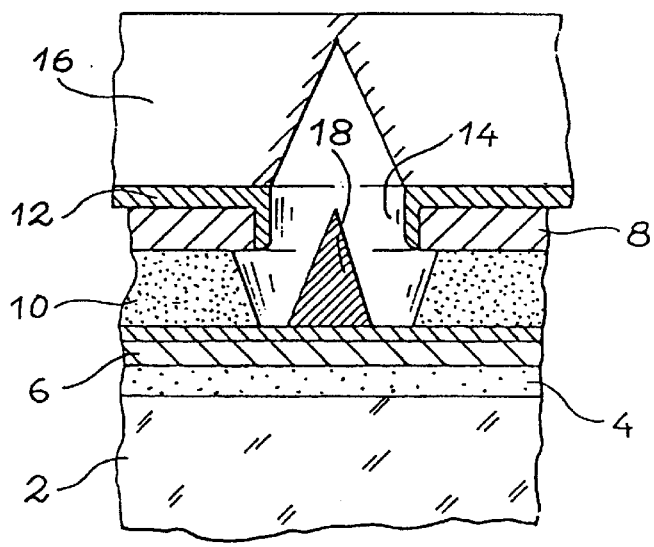
Figure 3:
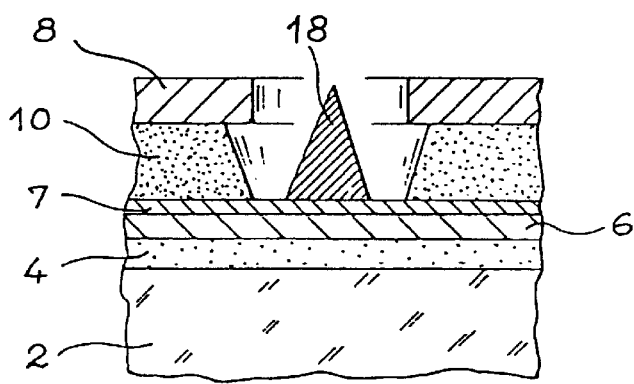

For reasons of simplification, some parts of the stack 101 which correspond to parts of the stack shown on FIGS. 1 to 3 are designated with the same reference numbers with 100 added.

Hence, the stack 101 comprises a substrate 102, overlaid, in that order, by an electrically insulating layer 104, a system of cathode electrical conductors 106, a resistive layer 107, an electrically insulating intermediate layer 110 and grids 108 superimposed in criss-cross form.

On the surface of the stack 101, i.e. above the grids 108, an etching mask is formed with openings that correspond to holes that are to be made in the layers 108 and 110 of the stack 101.

The holes that are to be made in the layers 108 and 110 correspond to the holes 14 shown in FIG. 1.

To produce the etching mask, a layer of photosensitive resin 120 is formed on the surface of the stack 101, i.e. on layer 108, and the openings (holes) are made in accordance with the method of the invention.

Hence, a membrane 121 with micro-perforations 122 is laid onto layer 120, the layer of photosensitive resin is insolated with insolation light 123 in order to print areas 125 of the layer 120 corresponding to the micro-perforations 122 in the membrane 121, the membrane 121 is separated and the layer of resin is developed. The membrane 121 can be efficiently laid onto layer 120 using, for example, electrostatic forces.

Membrane 121, which plays the part of an optical mask, is laid onto the resin layer 120. This permits this layer to be covered uniformly and thereby prevents any parasitic light between it and the membrane.

The membrane 121 can be a micro-perforated filtration membrane of the type sold by the Whatman company in Belgium. However, any other type of membrane can be suitable. Its thickness, from a few micrometers to a few tens of micrometers is selected so as to be appropriate to the passage of light in the micro-perforations 122.

The membrane 121 can also be manufactured, for example, by irradiating a polymer film with heavy ions with an energy of the order of 1 MeV, then dissolving the parts of the polymer film which have been subjected to interaction with the electron cloud of the ions. On this subject, reference can be made to documents (5) and (6) given as references at the end of this description.

In a preferred way, the membrane material 121, i.e. the optical mask material, is chosen to be opaque to the insolation light 123 so that the insolation light only passes through the micro-perforations 122. In the case when an optical mask (membrane) is used made of a material that is not completely opaque, a photo-sensitive resin can be chosen whose speed of dissolution during development is very much greater in the areas insolated through the micro-perforations than in the masked areas.

The insolation light, indicated by reference number 123 comes, for example, from a source of parallel ultra-violet light (not shown) arranged, preferably, in such a way that the rays arrive perpendicular to the upper surface of the membrane.

The insolation time is chosen to be sufficiently long for the resin layer 120 to be insolated through its entire thickness in the areas 125.

After insolation, the membrane 121 is removed from the surface of layer 120, and this layer is developed in order to form holes (openings) in it, in the insolated areas.

Figure 5:
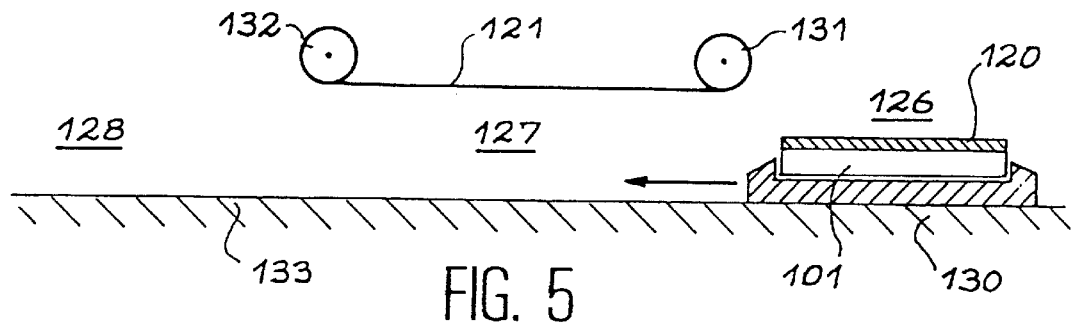
FIGS. 5, 6 and 7 show a device for the implementation of this invention and illustrate the steps of a particular way of implementing the method of the invention.
Figure 6:
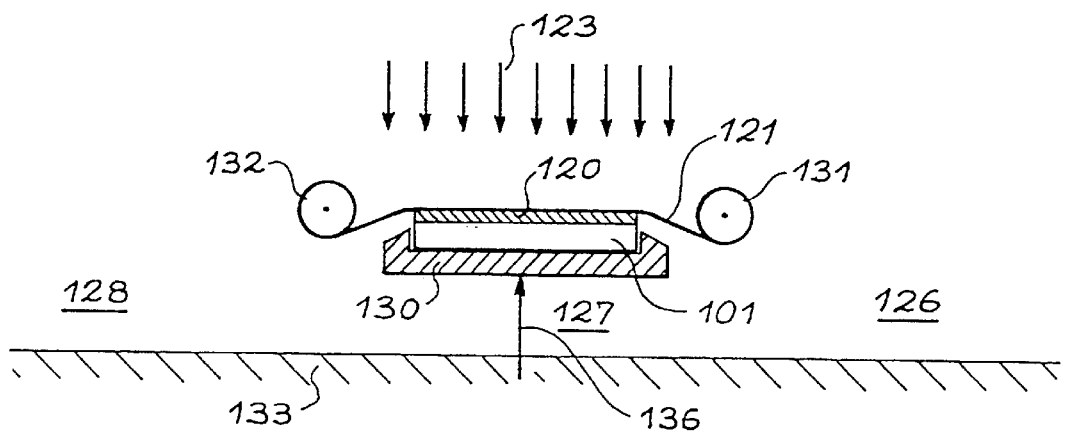
Figure 7:
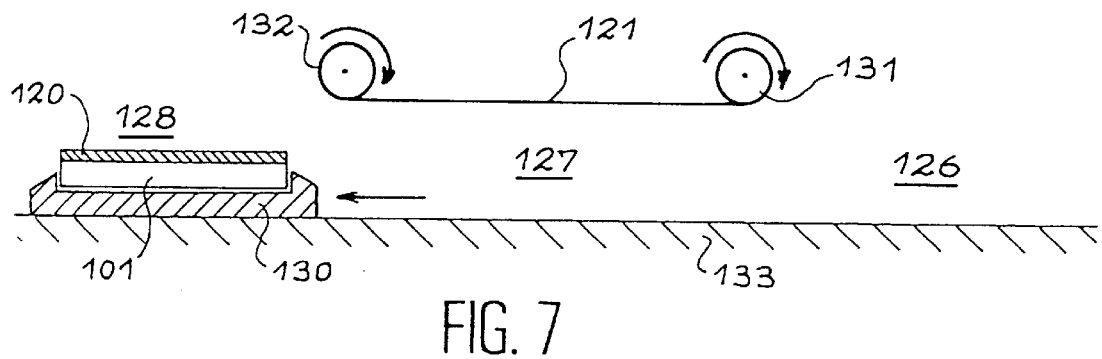

FIGS. 5, 6 and 7 illustrate a particular way of implementing the method of the invention and show an apparatus provided for this purpose. Identical or similar parts of FIGS. 4, 5, 6 and 7 carry the same reference numbers. It is therefore possible to refer to the description of FIG. 4 for certain corresponding parts of FIGS. 5, 6 and 7.

The apparatus provided for the implementation of the invention, in the context of line manufacturing, comprises, as shown in FIG. 5, a line with a conveyor 133 capable of moving an item to be treated, successively from a loading station 126, to an insolation station 127 where the item is opposite a micro-perforated membrane 121, and then from this station 127 to an unloading station 128.

The item to be treated made up of a stack 101 covered by a layer of photosensitive material 120 is arranged on a substrate carrier 130 at the loading station 126.

The apparatus also comprises a system for the distribution of blank membrane for the insolation of the photo-sensitive layer 120. This system includes a first supply spool 131 with a roll of blank membrane and a receiving spool 132 for the membrane after use.

This system allows the use of a portion of blank membrane, that is to say membrane which has not been subjected to insolation, for each new item to be treated.

Spools 131 and 132 are arranged in such a way that a portion of blank membrane 121 is stretched between them with a surface area corresponding to the surface of the photo-sensitive layer. The tension of the membrane 121 can be adjusted so that it is laid uniformly onto the photo-sensitive layer 120.

At the insolation station, means are provided for moving the substrate carrier 130 in a direction perpendicular to the membrane 121. These means are represented in FIG. 6, in a simplified fashion, by an arrow 136. It is possible, for example, to use an air jack to lift the substrate carrier and thereby lay the membrane 121 onto the photosensitive layer 120.

The layer 120 is insolated in this position by insolation light 123 in accordance with the description given when referring to FIG. 4.

The light 123 is provided, for example, by an ultra-violet insolation source which has not been shown. The apparatus assembly for the implementation of the method is preferably located in an environment of inactinic light which does not insolate the resin in a parasitic way.

As shown in FIG. 7, after insolation, the layer 120 is separated from the membrane 121 by lowering the substrate carrier 130, and the conveyor 133 moves the assembly formed by the substrate carrier 130 and the substrate 101 covered by layer 120, to the unloading station.

There, the substrate and the layer 120 are unloaded from the substrate carrier and the photo-sensitive material of layer 120 is developed, in order to form, as described above, holes or openings, in the insolated areas.

The ease of implementation of the method of the invention, its low cost, the possibility of its integration into a production line are advantages of the invention which permit very varied industrial applications.

As described above, the method of forming holes in a layer of photo-sensitive material can be put to beneficial use in the production of large surface area micro-point screens.

Another application of the method can be the production of micro-perforated membranes on substrates of rigid materials such as silicon wafers. These are then etched through a mask with holes created in accordance with the invention.

In the same way, etched optical systems of the antiglare type can be produced over large surface areas.

By way of example, a transparent oxide layer, for example of indium tin oxide (ITO), having numerous holes through it, with a diameter of the order of 1 $\mu$m, can be used as a antiglare layer, for example, for liquid crystal screens. The ITO layer is etched with a mask of photosensitive material in which holes (or openings) are made in accordance with the invention.

DOCUMENTS MENTIONED IN THIS DESCRIPTION (1) FR-A-2 593 953 (see also EP-A-0 234 989)
(2) US-A-4 857 161
(3) FR-A-2 663 462
(4) FR-A-2 687 839 (see also EP-A-0 558 393)
(5) "Production and application of nuclear track microfilters" by P. VATER—Nuclear Track Radiat. Meas., vol. 15, No. 1–4, pp. 743–749, 1988
(6) "Ion Tracks and Microtechnology Principles and Applications" by Reimar Spohr, edited by Klaus Bethge.

We claim:
1. A method for forming holes in a layer of photosensitive material arranged on a stack, said method comprising the steps of:
   selecting a filtration membrane having micro-perforations;
   disposing the membrane on the layer of photosensitive material;
   insolating the membrane with light so as to expose areas of the layer of photosensitive material to the light, said areas corresponding to the micro-perforations of the membrane;
   separating the membrane from the layer of photosensitive material; and
   developing the layer of photosensitive material in order to form holes corresponding to the insolated areas in the layer of photosensitive material.

2. A method according to claim 1, wherein the membrane is composed of a material opaque to the insolation light.

3. A method according to claim 1, wherein the micro-perforations of the membrane are randomly distributed at a substantially constant density.

4. A method according to claim 1, wherein the micro-perforations of the membrane have a diameter between 0.2 and 20 $\mu$m.

5. A method according to claim 1, wherein the membrane is disposed on the layer of photosensitive material by the use of electrostatic forces.

6. A method according to claim 1, wherein the photosensitive material is a photosensitive resin; and further comprising the step of heat hardening the layer of photosensitive material before the membrane is disposed on the layer of photosensitive material.

7. A method according to claim 1, wherein the membrane is flexible so as to be capable of being rolled up on a spool.

8. A method for forming a source of micro-point cathode electrons, said method comprising the steps of:

selecting a structure comprising:
- a substrate;
- cathode conductors disposed over the substrate;
- an electrically insulating layer disposed over the cathode conductors; and
- grids disposed over the electrically insulating layer;

selecting a layer of photosensitive material;

disposing the layer of photosensitive material on the structure;

selecting a filtration membrane having micro-perforations;

disposing the membrane on the layer of photosensitive material using electrostatic forces;

insolating the membrane with light so as to expose areas of the layer of photosensitive material to the light, said areas corresponding to the micro-perforations of the membrane;

separating the membrane from the layer of photosensitive material;

developing the layer of photosensitive material in order to form openings corresponding to the insolated areas in the layer of photosensitive material;

forming holes in the grids and the electrically insulating layer in areas where the grids cross the cathode conductors, said holes being formed through the openings in the layer of photosensitive material; and forming micro-points of electron-emitting material in the holes, on the cathode conductors.

9. A method for forming holes in a layer of photosensitive material arranged on a stack, said method comprising the steps of:

selecting a filtration membrane having micro-perforations;

disposing the membrane on the layer of photosensitive material using electrostatic forces;

insolating the membrane with light so as to expose areas of the layer of photosensitive material to the light, said areas corresponding to the micro-perforations of the membrane;

separating the membrane from the layer of photosensitive material; and developing the layer of photosensitive material in order to form holes corresponding to the insolated areas in the layer of photosensitive material.

* * * * *